(12) United States Patent
Lee

(10) Patent No.: US 8,310,882 B2
(45) Date of Patent: Nov. 13, 2012

(54) PACKAGE APPARATUS AND METHOD OF OPERATING THE SAME

(75) Inventor: Sang Kyu Lee, Chungcheongbuk-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 251 days.

(21) Appl. No.: 12/774,665

(22) Filed: May 5, 2010

(65) Prior Publication Data
US 2010/0302876 A1    Dec. 2, 2010

(30) Foreign Application Priority Data

May 29, 2009 (KR) .................. 10-2009-0047826

(51) Int. Cl.
*G11C 7/06* (2006.01)
(52) U.S. Cl. ............. 365/189.07; 365/49.17; 365/226
(58) Field of Classification Search ........... 365/189.07, 365/49.17, 226
See application file for complete search history.

(56) References Cited

U.S. PATENT DOCUMENTS

| 6,331,950 | B1 * | 12/2001 | Kuo et al. | 365/185.18 |
| 6,381,192 | B1 * | 4/2002 | Ahn et al. | 365/230.08 |
| 6,636,081 | B1 * | 10/2003 | Lee | 327/72 |
| 6,882,570 | B2 * | 4/2005 | Byeon et al. | 365/185.18 |
| 7,102,395 | B2 * | 9/2006 | Saito | 327/74 |

FOREIGN PATENT DOCUMENTS

| KR | 100378603 | 3/2003 |
| KR | 100519536 | 10/2005 |

OTHER PUBLICATIONS

Notice of Preliminary Rejection issued from Korean Intellectual Property Office on Nov. 10, 2010.

* cited by examiner

*Primary Examiner* — Son Dinh
*Assistant Examiner* — Nam Nguyen
(74) *Attorney, Agent, or Firm* — IP&T Group LLP

(57) ABSTRACT

A package apparatus includes at least one memory chip, a voltage detection circuit configured to make a determination of whether a voltage supplied to the memory chip is a specific voltage or higher, and a controller configured to control an operation of the memory chip based on a result of the determination.

18 Claims, 3 Drawing Sheets

PACKAGE APPARATUS AND METHOD OF OPERATING THE SAME

CROSS-REFERENCE TO RELATED APPLICATION

Priority to Korean patent application number 10-2009-0047826 filed on May 29, 2009, the entire disclosure of which is incorporated by reference herein, is claimed.

BACKGROUND

Exemplary embodiments relate to a package apparatus and, more particularly, to a package apparatus and a method of operating the same, wherein data stored in the content-addressable memory (CAM) cell of a nonvolatile memory chip is loaded after a power source has stabilized.

Recently, with an increasing demand for mobile products, such as camcorders, digital cameras, portable phones, and MPEG-1 Layer3 (MP3) players, attempts are being made to further improve the operating performance of the mobile products.

Internal options for a nonvolatile memory device applied to a specific mobile product are determined so that they comply with the operating characteristics of the mobile product, and so the nonvolatile memory device is operated in accordance with a corresponding application program.

With the development of new technologies, the number of application programs for a specific mobile product has increased. Accordingly, there is a growing need for techniques for reliably assigning various options to a corresponding nonvolatile memory device.

In the past, option information was stored in the fuse, etc. of a nonvolatile memory device. However, because of the large area occupied by a fuse, option information is now often stored in the CAM cell of a nonvolatile memory device. The amount and degree of integration of nonvolatile memory devices is increasing.

A nonvolatile memory device, in which the option information is stored in a CAM cell, when being powered up, needs to perform an operation of loading data stored in the CAM cell during a reset operation and then storing the loaded data in an internal register. The operation of loading the data of the CAM cell is performed after the voltage has stabilized to a certain voltage level.

A large amount of current is necessary for the operation of loading the data of the CAM cell. Accordingly, a nonvolatile memory device determines whether the voltage has stabilized and then performs the operation of loading the data of the CAM cell after the voltage has stabilized.

Some packages, each including a nonvolatile memory device, are configured to load data stored in a CAM cell in response to a command generated by an external controller. In this case, after voltage supplied to the external controller has stabilized, the external controller inputs a command to a corresponding nonvolatile memory chip so that it loads the data of the CAM cell.

Here, the voltage supplied to the nonvolatile memory chip is stabilized at a later point in time than the voltage supplied to the external controller. In this case, since the operation of loading the data of the CAM cell, which requires a large amount of current, is performed in a state in which the voltage supplied to the nonvolatile memory chip has not yet stabilized, a malfunction can occur in loading the data of the CAM cell.

FIG. 1 is a graph showing a comparison between the time taken for the voltage of an external controller to stabilize and the time taken for the voltage of a memory chip to stabilize. This figure shows the difference between the time taken for the voltage supplied to a memory chip to stabilize and the time taken for the voltage supplied to an external controller to stabilize.

If a command to load data stored in a CAM cell is inputted after the voltage supplied to the external controller has stabilized and before the voltage supplied to the memory chip has stabilized, an error results in reading the data of the CAM cell because the voltage supplied to the memory chip has not yet stabilized.

If the data of the CAM cell is loaded after the voltage of the memory chip has stabilized, the data of the CAM cell can normally be read without error. However, the known external controllers are unable to determine whether the voltage of the memory chip has stabilized.

BRIEF SUMMARY

Exemplary embodiments relate to a package apparatus and a method of operating the same in which data stored in a CAM cell is loaded after voltage supplied to a memory chip has stabilized.

A package apparatus according to an aspect of the present disclosure includes at least one memory chip, a voltage detection circuit configured to make a determination of whether a voltage supplied to the memory chip is a specific voltage or higher, and a controller configured to control an operation of the memory chip based on a result of the determination.

If, as a result of the determination, the voltage supplied to the memory chip is the specific voltage or higher, the controller generates a command for controlling the operation of the memory chip.

The voltage detection circuit includes a voltage detection unit configured to output a detection voltage based on the voltage supplied to the memory chip and a comparison unit configured to make a comparison of the detection voltage and a reference voltage and output a control signal based on a result of the comparison.

The voltage detection unit includes a first and second resistor means for dividing the voltage supplied to the memory chip and outputting a divided voltage as the detection voltage.

When the detection voltage is higher than the reference voltage, the comparison unit outputs the control signal of a high level.

When the control signal of a high level is output, the controller inputs a command to the memory chip for loading option information stored in a CAM cell.

The comparison unit includes a first comparator configured to compare the detection voltage and the reference voltage and output a first comparison voltage, a second comparator configured to compare the first comparison voltage and the reference voltage and output a second comparison voltage, and an inverter configured to invert a level of the second comparison voltage and output a voltage of an inverted level.

The first comparator outputs the first comparison voltage, having a same level as a voltage supplied to the controller, when the detection voltage is higher than the reference voltage. The second comparator outputs the second comparison voltage, having the same level as the voltage supplied to the controller, when the first comparison voltage is higher than the reference voltage.

A package apparatus according to another aspect of the present disclosure includes a memory chip including a CAM cell for storing an option information, a controller including a voltage detection circuit for checking whether a voltage supplied to the memory chip is a specific voltage or higher. The controller inputs a command to the memory chip for loading the option information stored in the CAM cell, after the voltage detection circuit has checked that the voltage supplied to the memory chip is the specific voltage or higher.

The voltage detection circuit includes a voltage detection unit configured to output a detection voltage based on the voltage supplied to the memory chip and a comparison unit configured to make a comparison of the detection voltage and a reference voltage and output a control signal based on a result of the comparison.

The voltage detection unit includes a first and second resistor means for dividing the voltage supplied to the memory chip and outputting a divided voltage as the detection voltage.

When the detection voltage is higher than the reference voltage, the comparison unit outputs the control signal of a high level.

When the control signal of a high level is output, the controller inputs a command to the memory chip for loading the option information stored in the CAM cell.

The comparison unit includes a first comparator configured to compare the detection voltage and the reference voltage and output a first comparison voltage, a second comparator configured to compare the first comparison voltage and the reference voltage and output a second comparison voltage and an inverter configured to invert a level of the second comparison voltage and output an output voltage of the inverter of an inverted level.

The first comparator outputs the first comparison voltage, having the same level as a voltage supplied to the controller, when the detection voltage is higher than the reference voltage. The second comparator outputs the second comparison voltage, having the same level as the voltage supplied to the controller, when the first comparison voltage is higher than the reference voltage.

If the output voltage of the inverter shifts to a low level, the controller inputs the command to the memory chip for loading the option information stored in the CAM cell.

In accordance with yet another aspect of the present disclosure, there is provided a method of operating a package apparatus, including a controller and at least one memory chip including a CAM cell, the method including inputting a power source, making a determination via the controller whether a voltage supplied to the memory chip has reached a specific voltage, and controlling an operation of the memory chip by inputting via the controller a command to the memory chip for loading an option information stored in the CAM cell if, as a result of the determination, the voltage supplied to the memory chip is determined to have reached the specific voltage.

The method further includes loading a register in the memory chip with the option information stored in the CAM cell and temporarily storing the loaded option information.

DESCRIPTION OF EXEMPLARY EMBODIMENTS

Hereinafter, some exemplary embodiments of the present disclosure will be described in detail with reference to the accompanying drawings. The figures are provided to merely illustrate the exemplary embodiments of the disclosure and are not meant to limit the scope of these embodiments and their equivalents which would be understood by those having ordinary skill in the art upon reading this disclosure.

Figure 1:
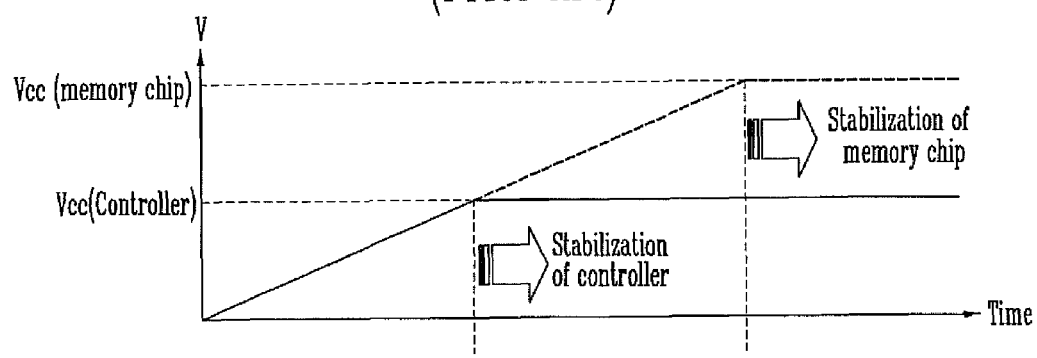
FIG. 1 is a graph showing a comparison between the time taken for the voltage of an external controller to stabilize and the time taken for the voltage of a memory chip to stabilize.
Figure 2A:
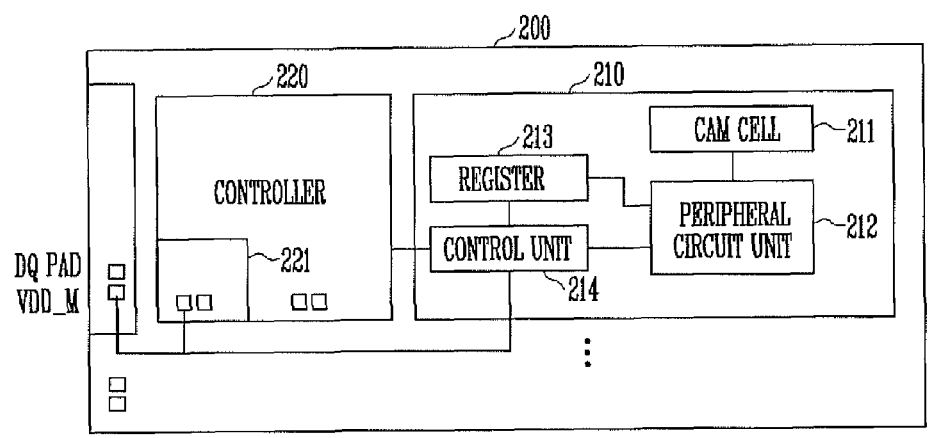
FIG. 2A is a block diagram of a package apparatus according to an embodiment of this disclosure.

FIG. 2A is a block diagram of a package apparatus according to an exemplary embodiment of this disclosure.

Referring to FIG. 2A, the package apparatus 200 according to the embodiment of this disclosure includes one or more memory chips 210 and a controller 220.

Each of the memory chips 210 includes a CAM cell 211, a peripheral circuit unit 212, a register 213, and a control unit 214. The controller 220 includes a voltage detection circuit 221.

The CAM cell 211 stores option information on which the corresponding memory chip 210 is operated. The peripheral circuit unit 212 includes a circuit configured to load data stored in the CAM cell 211 and store loaded data, a memory cell array commonly included in the memory chip 210, a circuit, such as a page buffer, and so on.

The register 213 temporarily stores the option information, stored in the CAM cell 211, during the operation of the memory chip 210. The control unit 214 loads the option information, stored in the CAM cell 211, in response to a command generated by the controller 220 and stores the loaded option information in the register 213.

The controller 220 enables the memory chip 210 and transfers an external operation command to them. Furthermore, the controller 220 generates a command on which the control unit 214 loads the option information of the CAM cell 211 and stores the loaded option information in the register 213.

Here, after the voltage detection circuit 221 determines whether a voltage VCC_M supplied to the memory chip 210 has stabilized, the controller 220 inputs the command for loading the option information stored in the CAM cell on the basis of a result of the determination.

The voltage detection circuit 221 is configured as follows.

Figure 2B:
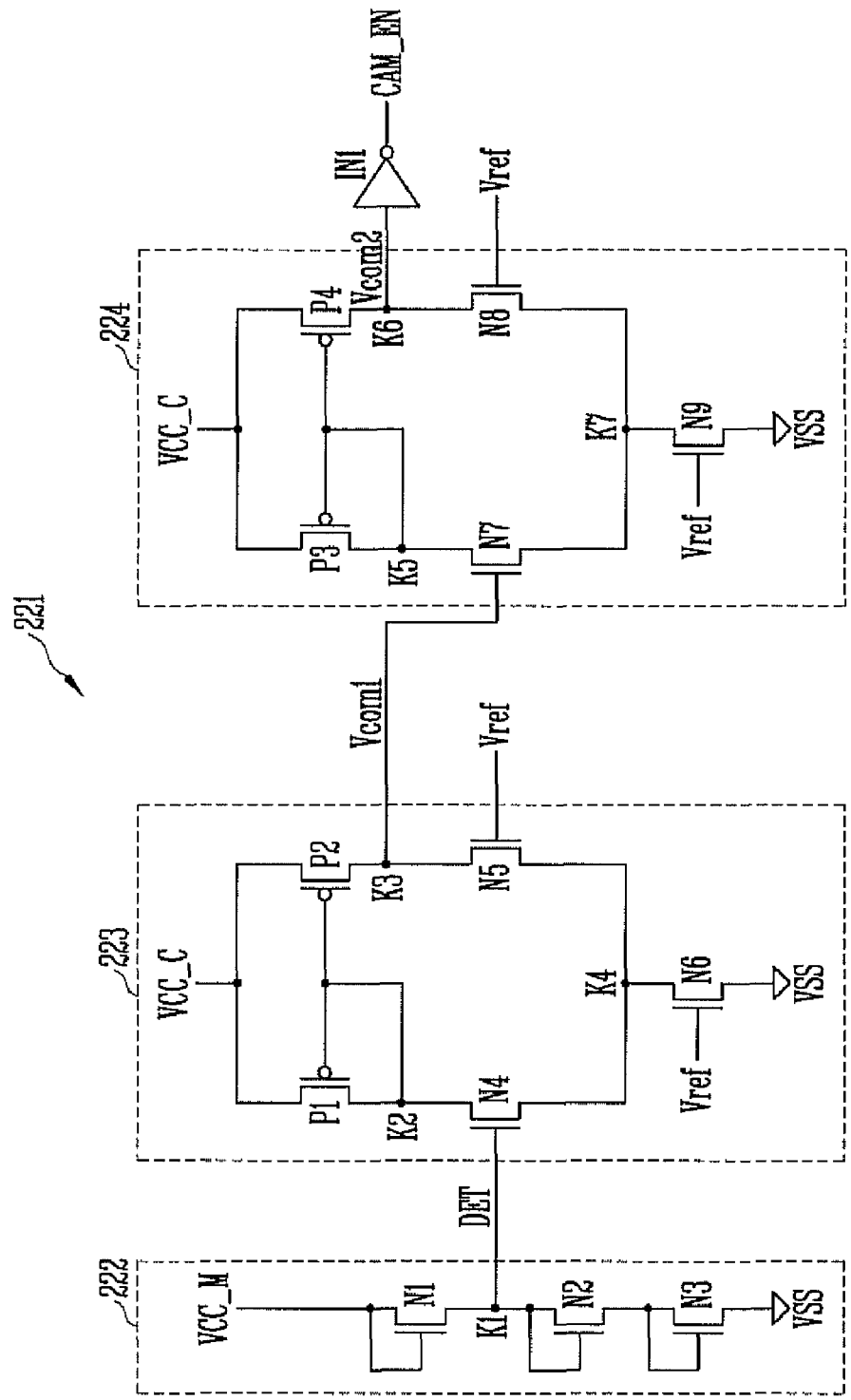
FIG. 2B is a detailed circuit diagram of a voltage detection circuit according to the embodiment shown in FIG. 2A.

FIG. 2B is a detailed circuit diagram of the voltage detection circuit 221 shown in FIG. 2A.

Referring to FIG. 2B, the voltage detection circuit 221 includes a voltage detection unit 222 and first and second comparators 223, 224.

The voltage detection unit 222 divides the voltage VCC_M, supplied to the memory chip 210, on the basis of a resistance ratio according to a diode and outputs a divided voltage as a detection voltage DET.

The first comparator 223 compares the detection voltage DET and a reference voltage Vref and outputs a first comparison voltage Vcom1 as a result of the comparison. The second comparator 224 compares the first comparison voltage Vcom1 and the reference voltage Vref and outputs a second comparison voltage Vcom2 as a result of the comparison.

An inverter IN1 inverts a level of the second comparison voltage Vcom2 and outputs voltage at an inverted level. The output of the inverter IN1 is a CAM cell enable signal CAM_EN for inputting a CAM cell data loading command.

The first comparison voltage Vcom1 output by the first comparator 223 may be used as the CAM cell enable signal CAM_EN without using the second comparator 224. However, if the second comparator 224 is used, the CAM cell enable signal CAM_EN can be more reliable.

The controller 220 outputs the CAM cell data loading command in response to the CAM cell enable signal CAM_EN.

The voltage detection unit 222 includes first to third NMOS transistors N1 to N3. The first comparator 223 includes first and second PMOS transistors P1, P2 and fourth to sixth NMOS transistors N4 to N6.

The second comparator 224 includes third and fourth PMOS transistors P3, P4 and seventh to ninth NMOS transistors N7 to N9.

The first to third NMOS transistors N1 to N3 are coupled in series between a ground node and a terminal for the voltage VCC_M. The first to third NMOS transistors N1 to N3 are constructed in the form of a diode. That is, the gate and the drain of each of the first to third NMOS transistors N1 to N3 are coupled together. The detection voltage DET is output from a node K1 of the first and second NMOS transistors N1, N2.

The first PMOS transistor P1 is coupled between a node K2 and a terminal for voltage VCC_C supplied to the controller 220. The second PMOS transistor P2 is coupled between a node K3 and the terminal for voltage VCC_C supplied to the controller 220.

The gates of the first and second PMOS transistors P1, P2 are in common coupled to the node K2.

The fourth NMOS transistor N4 is coupled between the node K2 and a node K4. The fifth NMOS transistor N5 is coupled between the node K3 and the node K4. The detection voltage DET is inputted to the gate of the fourth NMOS transistor N4. The reference voltage Vref is inputted to the gate of the fifth NMOS transistor N5.

The first comparison voltage Vcom1 is output from the node K3.

The sixth NMOS transistor N6 is coupled between the node K4 and the ground node. The reference voltage Vref is inputted to the gate of the sixth NMOS transistor N6.

The third PMOS transistor P3 is coupled between a node K5 and the terminal for voltage VCC_C supplied to the controller 220. The fourth PMOS transistor P4 is coupled between a node K6 and the terminal for voltage VCC_C supplied to the controller 220.

The gates of the third and fourth PMOS transistors P3, P4 are in common coupled to the node K5.

The seventh NMOS transistor N7 is coupled between the node K5 and a node K7. The eighth NMOS transistor N8 is coupled between the node K6 and the node K7. The gate of the seventh NMOS transistor N7 is coupled to the node K3. The reference voltage Vref is inputted to the gate of the eighth NMOS transistor N8.

The ninth NMOS transistor N9 is coupled between the node K7 and the ground node. The reference voltage Vref is inputted to the gate of the ninth NMOS transistor N9.

The second comparison voltage Vcom2 is output from the node K6. The inverter IN1 inverts a level of the second comparison voltage Vcom2 and outputs voltage of an inverted level. The output of the inverter IN1 is the CAM cell enable signal CAM_EN.

The operation of the voltage detection circuit 221 is described below.

When a power source is supplied to the package apparatus 200, the voltage VCC_C supplied to the controller 220 is stabilized faster than the voltage VCC_M supplied to the memory chip 210.

When the voltage VCC_M is supplied to the memory chip 210, the voltage detection unit 222 of the voltage detection circuit 221 outputs the detection voltage DET based on the ratio of the resistance of the first NMOS transistor N1 and the resistance of the second and third NMOS transistors N2, N3.

The first comparator 223 compares the detection voltage DET and the reference voltage Vref. If, as a result of the comparison, the detection voltage DET is higher than the reference voltage Vref, the first comparator 223 outputs the first comparison voltage Vcom1 at the same level as the voltage VCC_C supplied to the controller 210.

The operation of the first comparator 223 is described below.

First, when the reference voltage Vref is received, the sixth NMOS transistor N6 is turned on. If the detection voltage DET is less than the reference voltage Vref, the fifth NMOS transistor N5 is turned on. The fifth NMOS transistor N5 is turned on, and so the node K3 is coupled to the ground node.

Accordingly, the first comparison voltage Vcom1 has a ground voltage level.

If the voltage VCC_M supplied to the memory chip 210 rises, when the detection voltage DET is higher than the reference voltage Vref, the fourth NMOS transistor N4 is turned on.

When the fourth NMOS transistor N4 is turned on, the node K2 is coupled to the ground node. Thus, since the first and second PMOS transistors P1, P2 are turned on, the voltage VCC_C, supplied to the controller 220, is supplied to the node K3.

Accordingly, the first comparison voltage Vcom1 has the same level as the voltage VCC_C supplied to the controller 220.

The operation of the second comparator 224 is similar to that of the first comparator 223. When the first comparison voltage Vcom1 is higher than the reference voltage Vref, the voltage supplied to the node K6 has the same level as the voltage VCC_C supplied to the controller 220.

When the second comparison voltage Vcom2 has the same level as the voltage VCC_C of a high level, supplied to the controller 220, the inverter IN1 outputs the CAM cell enable signal CAM_EN of a low level.

When the CAM cell enable signal CAM_EN has a low level, the controller 220 inputs the command for loading data stored in the CAM cell to the memory chip 210. In response to the command, the memory chip 210 loads the data of the CAM cell after voltage has been stabilized.

Figure 3:
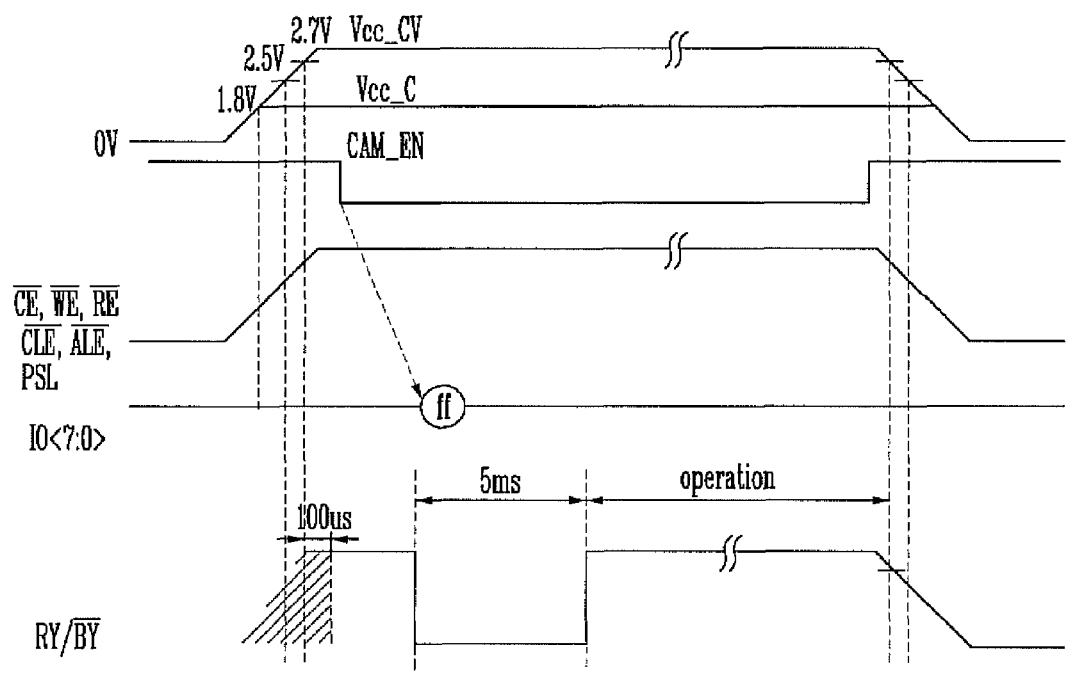
FIG. 3 is a timing diagram illustrating the operation of the package apparatus according to an embodiment of this disclosure.

FIG. 3 is a timing diagram illustrating the operation of the package apparatus according to an exemplary embodiment of this disclosure.

Referring to FIG. 3, when voltage is supplied to the controller 220 and the memory chip 210, the voltage VCC_C of the controller 220 is stabilized faster than the voltage VCC_M of the memory chip 210.

When the CAM cell enable signal CAM_EN shifts from a low level to a high level, the voltage detection circuit 221 determines that the voltage VCC_M supplied to the memory chip 210 has also been stabilized.

The controller 220 inputs the CAM cell data loading command for loading data stored in the CAM cell to the memory chip 210 via an IO path as a result of the determination. Accordingly, the memory chip 210 loads the data of the CAM cell in a stable voltage state.

As described above, in accordance with the package apparatus and the method of operating the same according to this disclosure, the external controller determines whether voltage supplied to the memory chip has stabilized and inputs the CAM cell data loading command. Accordingly, error occurring when data stored in the CAM cell is loaded can be prevented.

What is claimed is:

1. A package apparatus, comprising:
   at least one memory chip;
   a voltage detection circuit configured to make a determination of whether a voltage supplied to the memory chip is a specific voltage or higher; and
   a controller configured to control an operation of the memory chip based on a result of the determination,
   wherein the voltage detection circuit is configured to compare the voltage supplied to the memory chip and a reference voltage and compare a first comparison voltage produced as a result of the comparison and the reference voltage to output a control signal.

2. The package apparatus of claim 1, wherein if, as a result of the determination, the voltage supplied to the memory chip is the specific voltage or higher, the controller generates a command for controlling the operation of the memory chip.

3. The package apparatus of claim 2, wherein the voltage detection circuit comprises:

a voltage detection unit configured to output a detection voltage based on the voltage supplied to the memory chip; and a comparison unit configured to compare the detection voltage and the reference voltage and output the control signal based on the comparison by the comparison unit.

4. The package apparatus of claim 3, wherein the voltage detection unit comprises a first and second resistor means for dividing the voltage supplied to the memory chip and outputting a divided voltage as the detection voltage.

5. The package apparatus of claim 3, wherein, if the detection voltage is higher than the reference voltage, the comparison unit outputs the control signal of a high level.

6. The package apparatus of claim 5, wherein, if the control signal of a high level is output, the controller inputs a command to the memory chip for loading option information stored in a content-addressable memory (CAM) cell.

7. The package apparatus of claim 3, wherein the comparison unit comprises:

a first comparator configured to compare the detection voltage and the reference voltage and output the first comparison voltage;

a second comparator configured to compare the first comparison voltage and the reference voltage and output a second comparison voltage; and an inverter configured to invert a level of the second comparison voltage and output a voltage of an inverted level.

8. The package apparatus of claim 7, wherein:

the first comparator outputs the first comparison voltage, having a same level as a voltage supplied to the controller, when the detection voltage is higher than the reference voltage, and the second comparator outputs the second comparison voltage, having the same level as the voltage supplied to the controller, when the first comparison voltage is higher than the reference voltage.

9. A package apparatus, comprising:

a memory chip comprising a content-addressable memory (CAM) cell for storing an option information;

a controller comprising a voltage detection circuit for checking whether a voltage supplied to the memory chip is a specific voltage or higher, wherein the controller inputs a command to the memory chip for loading the option information stored in the CAM cell after the voltage detection circuit has checked that the voltage supplied to the memory chip is the specific voltage or higher, wherein the voltage detection circuit is configured to compare the voltage supplied to the memory chip and a reference voltage and compare a first comparison voltage produced as a result of the comparison and the reference voltage to output a control signal.

10. The package apparatus of claim 9, wherein the voltage detection circuit comprises:

a voltage detection unit configured to output a detection voltage based on the voltage supplied to the memory chip; and a comparison unit configured to compare the detection voltage and the reference voltage and output the control signal based on the comparison by the comparison unit.

11. The package apparatus of claim 10, wherein the voltage detection unit comprises first and second resistor means for dividing the voltage supplied to the memory chip and outputting a divided voltage as the detection voltage.

12. The package apparatus of claim 10, wherein, if the detection voltage is higher than the reference voltage, the comparison unit outputs the control signal of a high level.

13. The package apparatus of claim 12, wherein, if the control signal of a high level is output, the controller inputs a command to the memory chip for loading the option information stored in the CAM cell.

14. The package apparatus of claim 10, wherein the comparison unit comprises:

a first comparator configured to compare the detection voltage and the reference voltage and output the first comparison voltage;

a second comparator configured to compare the first comparison voltage and the reference voltage and output a second comparison voltage; and an inverter configured to invert a level of the second comparison voltage and output an output voltage of the inverter of an inverted level.

15. The package apparatus of claim 14, wherein:

the first comparator outputs the first comparison voltage, having a same level as a voltage supplied to the controller, when the detection voltage is higher than the reference voltage, and the second comparator outputs the second comparison voltage, having the same level as the voltage supplied to the controller, when the first comparison voltage is higher than the reference voltage.

16. The package apparatus of claim 14, wherein if the output voltage of the inverter shifts to a low level, the controller inputs the command to the memory chip for loading the option information stored in the CAM cell.

17. A method of operating a package apparatus, including a controller and at least one memory chip including a CAM cell, the method comprising:

inputting a power source;

making a determination via the controller whether a voltage supplied to the memory chip has reached a specific voltage; and controlling an operation of the memory chip by inputting via the controller a command to the memory chip for loading an option information stored in the CAM cell if, as a result of the determination, the voltage supplied to the memory chip is determined to have reached the specific voltage, wherein the making of the determination comprises comparing the voltage supplied to the memory chip and a reference voltage and comparing a first comparison voltage produced as a result of the comparison and the reference voltage to output a control signal.

18. The method of claim 17, further comprising loading a register in the memory chip with the option information stored in the CAM cell and temporarily storing the loaded option information.

* * * * *